United States Patent [19]

Quon et al.

[11] Patent Number: 5,316,075
[45] Date of Patent: May 31, 1994

[54] LIQUID JET COLD PLATE FOR IMPINGEMENT COOLING

[75] Inventors: William Quon, Alhambra; Herbert J. Tanzer, Topanga, both of Calif.

[73] Assignee: Hughes Aircraft Company, Los Angeles, Calif.

[21] Appl. No.: 994,823

[22] Filed: Dec. 22, 1992

[51] Int. Cl.⁵ ............................................. H01L 23/473
[52] U.S. Cl. ..................... 165/80.4; 165/104.33; 165/908; 361/699; 361/702
[58] Field of Search ............... 165/104.33, 908, 80.4; 361/699, 702

[56] References Cited

U.S. PATENT DOCUMENTS 4,494,171 1/1985 Bland et al. .................... 165/908

FOREIGN PATENT DOCUMENTS 136349 7/1985 Japan ........................... 165/908

Primary Examiner—Albert W. Davis, Jr.
Attorney, Agent, or Firm—L. A. Alkov; W. K. Denson-Low

[57] ABSTRACT

The cold plate is a multiple layer structure with an inlet manifold for pressurized coolant liquid. The manifold is covered by a nozzle plate which directs liquid coolant jets against the mounting plate. The mounting plate carries the device to be cooled. The high velocity liquid jets impinge directly on the mounting plate to minimize the boundary layer to enhance heat transfer from the mounting plate to the liquid coolant.

7 Claims, 3 Drawing Sheets

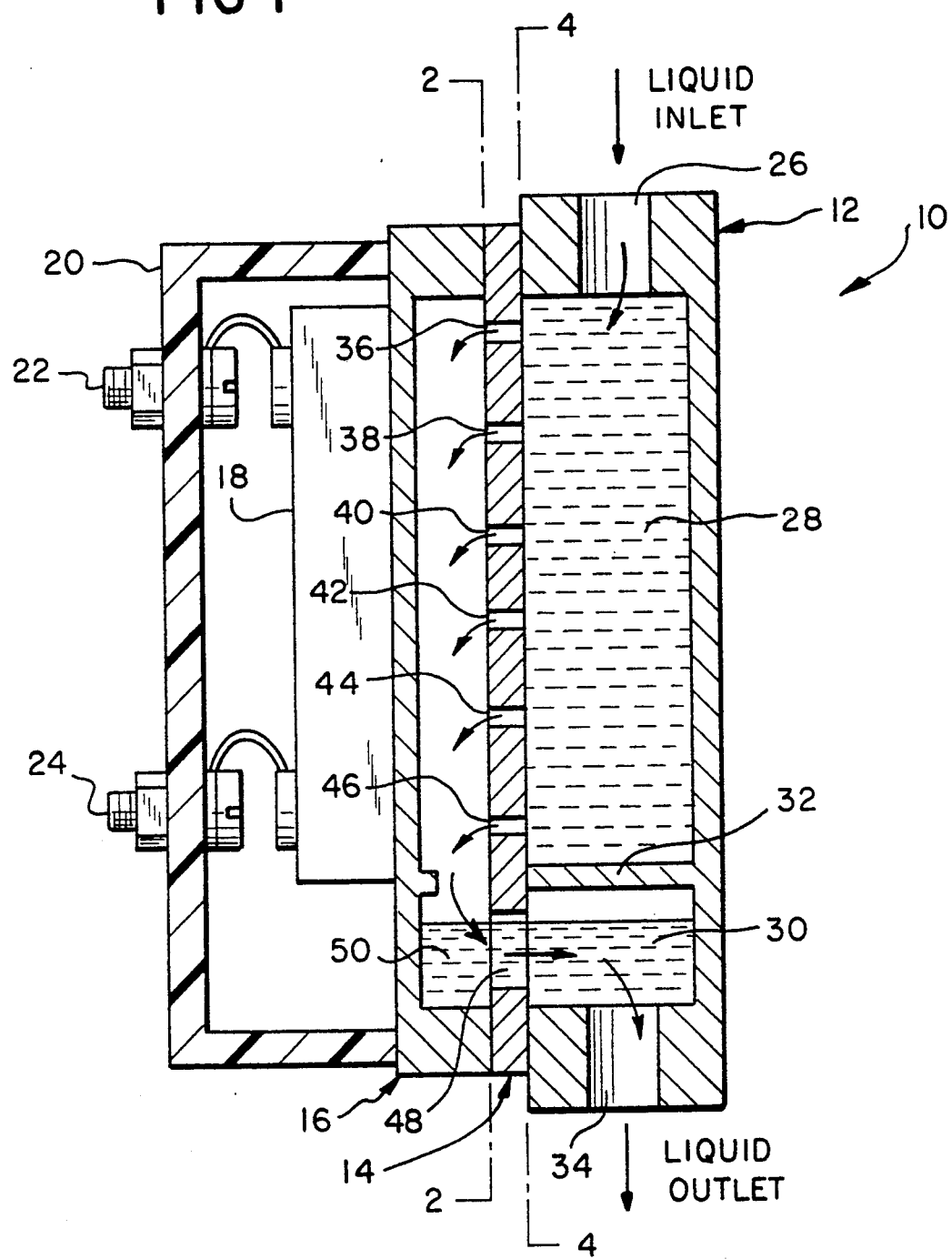

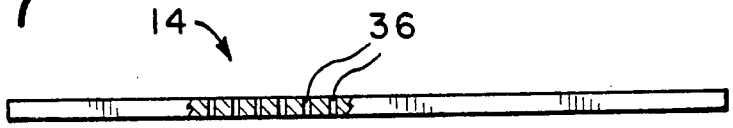
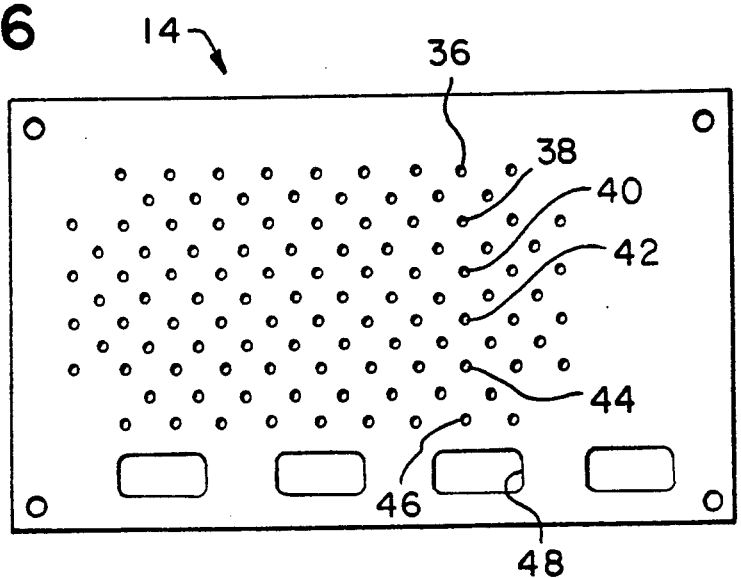
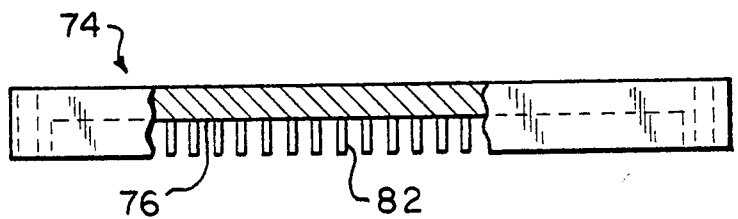
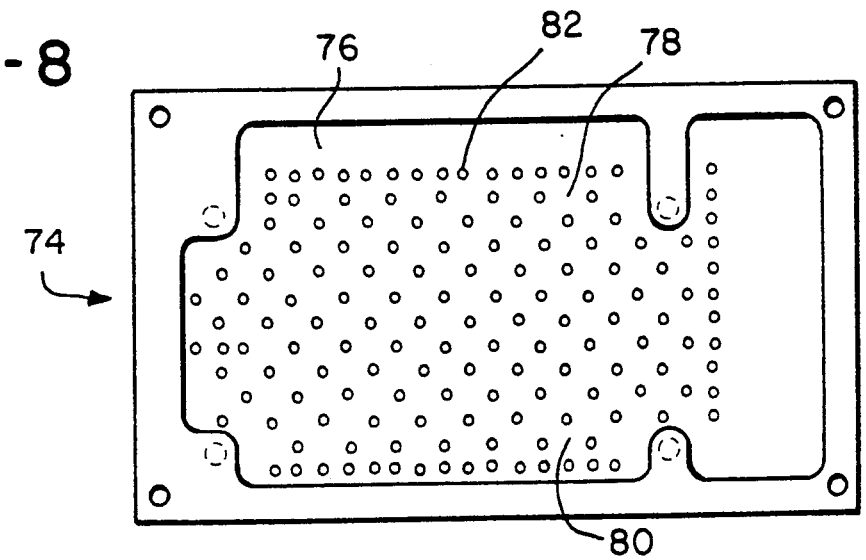

LIQUID JET COLD PLATE FOR IMPINGEMENT COOLING

FIELD OF THE INVENTION

This invention is directed to a cold plate for cooling other devices such as electronic devices. By employment of liquid coolant jets against the mounting plate, enhanced cooling is achieved with minimum flow.

BACKGROUND OF THE INVENTION

The power capacity of semiconductor electronic devices is limited by temperature. Semiconductor electronic devices are destroyed when their internal temperature reaches a particular limit. The limit depends upon the nature of the electronic device. In order to increase the electrical capacity of such devices, they have to be cooled. The manner of cooling depends on the amount of power available for the cooling process. Different cooling fluids are used, depending on the application and depending on the density of the electronic devices. In some cases, finned cold plates carry the electronic devices and convection cooling by ambient air is sufficient to prevent overheating of the electronic devices. In other cases, liquids are used. In some cases, they are boiling liquids such as fluorinated hydrocarbon refrigerants, which are delivered to the cold plate in liquid form and are boiled therein to remove heat. Such systems perhaps have the highest heat removal rate for a limited cold plate area, but require a considerable amount of power to operate. In other systems, a cold liquid is circulated through the cold plate and the cold liquid may be refrigerator cooled, evaporatively cooled, or convectively cooled to the atmosphere. At relatively low pumping rates, with consequent low pumping power, a significant boundary layer builds on the various surfaces within the cold plate to reduce heat transfer rates. In an attempt to increase heat transfer, the mounting plate often carried fins thereon in order to increase interface area. However, as stated above, the velocity of the flow and, therefore, the forced convection heat transfer coefficient is controlled by the flow channel configuration. High liquid coolant velocities are achieved with small channels, but the fin and channel sizes are limited by manufacturing capabilities. Furthermore, high efficiency localized cooling was not possible in these structures because the coolant liquid must travel along the full length of the fins and the mounting plate. With the boundary layer built up over the large area, heat transfer was inhibited.

SUMMARY OF THE INVENTION

In order to aid in the understanding of this invention, it can be stated in essentially summary form that it is directed to a liquid jet cold plate for impingement cooling. The cold plate includes an inlet manifold which has a nozzle plate thereon with nozzle openings therethrough. The nozzles direct coolant liquid toward a mounting plate on which the device to be cooled is mounted. The cooling jets discharged from the nozzles minimize heat transfer losses from the mounting plate to the cooling liquid.

It is a purpose and advantage of this invention to provide an efficient cold plate for the removal of heat from electronic devices and circuits, and particularly high power density devices and circuits.

It is another purpose and advantage of this invention to provide a liquid jet cold plate which utilizes high velocity liquid jets which improve cooling capacity by minimizing laminar liquid layers.

It is another purpose and advantage of this invention to provide a liquid jet cold plate in which nozzles direct jets of coolant liquid in patterns onto the mounting plate corresponding to the heat gain from devices carried by the mounting plate.

Other purposes and advantages of this invention will become apparent from a study of the following portion of this specification, the claims and the attached drawings wherein:

BRIEF DESCRIPTION OF THE DRAWINGS

FIG. 1 is a longitudinal section through the liquid jet cold plate in accordance with this invention.

FIG. 6 is a plan view of the nozzle plate, seen in the same orientation as FIG. 2.

FIG. 7 is an edge view thereof, with parts broken away and parts taken in section.

FIG. 8 is a view similar to FIG. 4 and showing an alternate mounting plate structure.

FIG. 9 is an edge view, with parts broken away and parts taken in section of the mounting plate of FIG. 8.

DESCRIPTION OF THE PREFERRED EMBODIMENT

Figure 5:
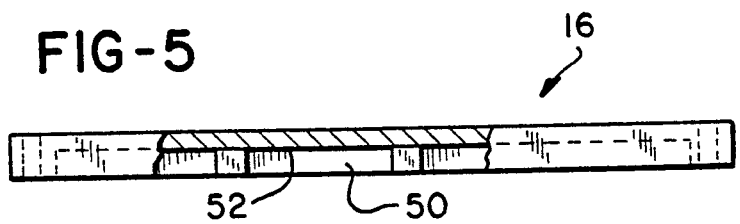
FIG. 5 is an edge view of the mounting plate, with parts broken away and parts taken in section.

The liquid jet cold plate of this invention is generally indicated at 10 in FIG. 1. The cold plate 10 is comprised of inlet manifold 12 (also seen in FIGS. 2 and 3), nozzle plate 14 (also seen in FIGS. 6 and 7), and mounting plate 16 (also seen in FIGS. 4 and 5). The mounting plate is configured to receive a device 18 which is to be cooled. It is contemplated in the present circumstances that the device 18 is an electrical device, and particularly an electronic device from which heat must be extracted in order to maintain the device at a sufficiently low temperature that it is operable. It is contemplated that the device 18 will be a semiconductor device, with one or more semiconductor junctures therein. The device 18 is shown as protected by dielectric cover 20. Terminals 22 and 24 are mounted through the cover and are connected by suitable wiring to the device 18 so that electrical connection to the device can be achieved externally of the cover. In the present instance, a high current device 18 is contemplated and, accordingly, only a few rather large electrical connections are shown. The cooled device 18 is mounted directly on the plate 16 by a low thermal resistance attachment. The cooling of the mounting plate is accomplished by the liquid jet impingement thereon, as described below.

Figure 2:
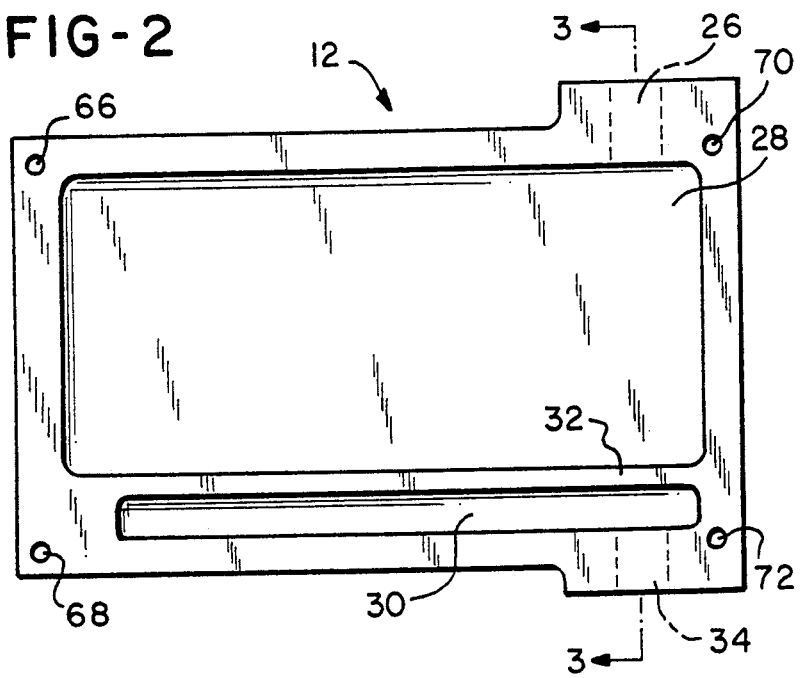
FIG. 2 is a plan view of the manifold, as seen generally along the line 2—2 of FIG. 1.
Figure 3:
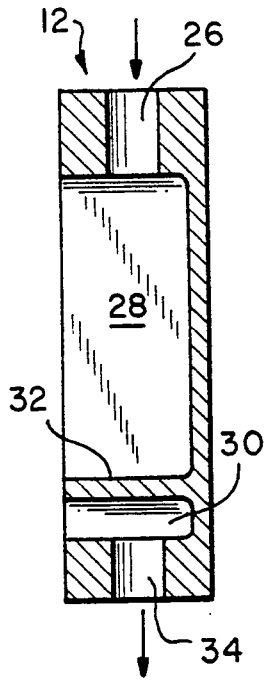
FIG. 3 is a section through the inlet manifold, as seen generally along the line 3—3 of FIG. 2.

As seen in FIGS. 1, 2 and 3, inlet manifold 12 has a liquid inlet 26 which enters into inlet manifold cavity 28. The inlet 26 may be of any convenient attachment character to permit the delivery of coolant liquid under pressure thereto. Outlet cavity 30 is separated from the inlet cavity 28 by means of wall 32. Outlet 34 permits the connection of tube or the like to drain away coolant liquid from the cold plate 10. Any conventional connection means may be employed.

Nozzle plate 14, seen in FIGS, 1, 6 and 7, overlies the top surface of the inlet manifold 12 in the same orientation as is seen in FIG. 2. Nozzle plate 14 is a flat plate, as seen in FIG. 7, which has a plurality of nozzle openings therein. Nozzles 36, 38, 40, 42, 44 and 46 are shown in line in FIGS. 1 and 6. It is seen that the nozzle openings are arranged in rectangular patterns facing the underside of the mounting plate where the device 18 is mounted. There are additional columns and rows of nozzles. These columns and rows are particularly arranged so as to impinge the area under the device 18. In addition, should some portions of the device 18 need more cooling than another, the nozzle positioning could be arranged at that location. In addition to the nozzle openings, the nozzle plate 14 has drain openings therein. Drain opening 48 is seen in FIGS. 1 and 6. When the nozzle plate is positioned on the inlet manifold 12, all of the nozzle openings overlie the inlet manifold cavity 28, and the drain openings overlie the outlet cavity 30.

Figure 4:
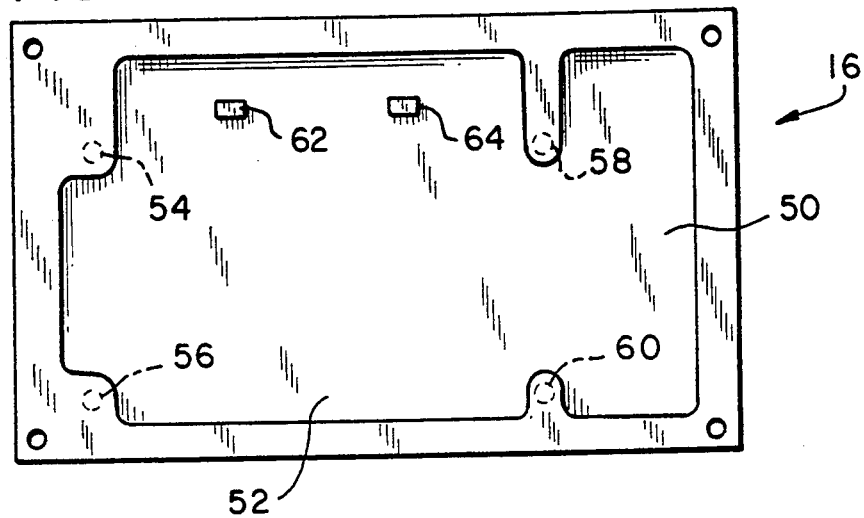
FIG. 4 is an underside view of the mounting plate, as seen generally along line 4—4 of FIG. 1.

Mounting plate 16 has a cavity. 50 therein, as seen in FIGS. 1, 4 and 5. The cavity 50 overlies the drain openings and nozzle openings in the nozzle plate. It is the cavity 50 into which the jets discharge against the underside 52 of the mounting plate 16. It is directly above this area of the mounting plate where the device 18 is mounted. Four holes 54, 56, 58 and 60 are blind-tapped from the top or device side of the mounting plate for the attachment of the device. As seen in FIG. 4, the full thickness of the mounting plate 16 is provided at these mounting holes by providing bosses which extend into the cavity. In addition, two posts 62 and 64 are positioned in the cavity in a position over the wall 32 to hold the nozzle plate firmly in place between the manifold and the mounting plate. The three parts of the cold plate are assembled together and are secured together by fastener holes in the four corners. Fastener holes 66, 68, 70 and 72 are shown in FIG. 2. Corresponding corner holes in nozzle plate 14, as seen in FIG. 6, and mounting plate 16, as seen in FIG. 4, are aligned when assembled. Through fasteners are employed, such as machine screws.

When the cold plate 10 is to be used to cool a device 18, the device 18 is installed on the cold plate and the cold plate is connected to a source of liquid coolant under pressure and connected to a liquid coolant drain. Preferably, the cold plate 10 is positioned on edge, with the liquid outlet in the downward position, as shown in FIG. 1. This aids in draining the coolant. Pressurized coolant liquid is supplied, and Jets issue from the nozzles and impinge on the underside 52 of the mounting plate. Since the jets of liquid are perpendicular to the surface being cooled, laminar boundary layers will be minimized or will not develop, improving the heat transfer coefficient.

When the cold plate 10 is used, the cavity 50 is air-filled with liquid droplets falling towards the liquid level at the outlet region, see FIG. 1.

The jets are produced by the nozzle openings. The nozzle openings are provided in numbers, locations and size of the holes with respect to the mounting plate to produce the desired heat transfer characteristics. It is also important to note that the jet openings can be made very small to maximize the flow velocity and heat transfer coefficient to minimize the pumping power required to provide sufficient coolant to accomplish the coolant task. A particularly useful application is in high-power switch hybrid semiconductor devices such as used in motor control of electric vehicles. The present cold plate allows higher power output with the same device, as compared to standard cooling. Better cooling with less power consumption is thus achieved.

To enhance heat transfer further, an alternate mounting plate 74 can be employed. This mounting plate is seen in FIGS. 8 and 9 and has the same inlet, outlet and cavity as the mounting plate 16. It is completely interchangeable with the mounting plate 16. Mounting plate 74 is enhanced by the employment of pins extending downward from its undersurface 76. The pins are inserted in holes in the mounting plate and extend downward to the bottom surface of the mounting plate, as seen in FIG. 9. The pins are on centers half the distance of the centers of the nozzles. However, there is no pin directly opposite a nozzle. When assembled, the space 78 between the pins is directly opposite nozzle 46, and the space 80 is directly opposite nozzle 36. In this way, the liquid jet issuing from the nozzle strikes the undersurface 76 of the mounting plate 74 and diverges therefrom. Therefore, the liquid jet intensity is not dissipated by the presence of a pin before it strikes the undersurface. However, as the liquid leaves that strike area to go to the outlet, it passes through the forest of pins. One of the pins is indicated at 82, and as previously stated, the pins are rectangularly arranged on rectangular centers half the distance between the nozzles. The pins 82 may be integrally formed by etching out the cavity and leaving the pin, or the pins may be inserted later. The pins significantly increase the heat transfer area.

This invention having been described in its presently contemplated best modes, it is clear that it is susceptible to numerous modifications, modes and embodiments within the ability of those skilled in the art and without the exercise of the inventive faculty. Accord-ingly, the scope of this invention is defined by the scope of the following claims.

What is claimed is:

1. A liquid jet cold plate comprising:
    an inlet manifold, said inlet manifold having a liquid coolant inlet passage and a spent liquid coolant outer passage, said manifold having a flat nozzle plate surface on one side thereof, an inlet cavity in said inlet manifold below said nozzle plate surface and an outlet cavity in said manifold below said nozzle plate surface, said inlet cavity being connected to said inlet passage and said outlet cavity being connected to said outlet passage, said outlet passage being for the discharge of spent liquid coolant;
    a substantially flat nozzle plate, said substantially flat nozzle plate having nozzle openings therein overlying said inlet cavity, said nozzle plate having at least one drain opening therein overlying said outlet cavity so that when liquid coolant under pressure is supplied to said inlet cavity liquid coolant jets issue from said nozzles;
    a mounting plate, said mounting plate having a mounting plate cavity overlying both said nozzle openings and said drain opening in said nozzle plate, said mounting plate having a cooling surface overlying said nozzle openings so that liquid collant jets issuing from said nozzle openings impinge on said cooling surface, said mounting plate having a mounting surface thereon directly over said cooling surface so as to maximize heat extraction from said mounting surface; and a plurality of pins extending from said cooling surface to increase the area of said mounting plate exposed to coolant liquid.

2. The cold plate of claim 1 wherein said manifold, said nozzle plate and said mounting plate area secured together.

3. The cold plate of claim 2 wherein an electronic device is mounted on said mounting means on said mounting surface so that said electronic device is cooled by coolant jetting through said nozzle openings against said cooling surface.

4. The cold plate of claim 3 wherein said electronic device is a power switching hybrid electronic device for the control of electric current to drive motors in an electric vehicle.

5. The cold plate of claim 1 wherein said pins are positioned to be away from said nozzle openings so that liquid coolant jets from said nozzle openings impinge against said cooling surface and drain away through said pins.

6. The cold plate of claim 5 wherein said manifold, said nozzle plate and said mounting plate are secured together.

7. The cold plate of claim 6 wherein an electronic device is mounted on said mounting means on said mounting surface so that said electronic device is cooled by coolant jetting through said nozzle openings against said cooling surface.

* * * * *

UNITED STATES PATENT AND TRADEMARK OFFICE
CERTIFICATE OF CORRECTION

PATENT NO. : 5,316,075
DATED : May 31, 1994
INVENTOR(S) : W. Quon et al.

It is certified that error appears in the above-indentified patent and that said Letters Patent is hereby corrected as shown below:

Claim 1, Column 4, line 42, delete "outer" and insert therefor --outlet--.

Claim 2, Column 5, line 6, delete "area" and insert therefor --are--.

Signed and Sealed this

Seventh Day of March, 1995

*Attest:*

BRUCE LEHMAN

*Attesting Officer*     *Commissioner of Patents and Trademarks*